US011543188B2

(12) United States Patent
Tan et al.

(10) Patent No.: US 11,543,188 B2
(45) Date of Patent: Jan. 3, 2023

(54) TEMPERATURE PLATE DEVICE

(71) Applicant: DELTA ELECTRONICS, INC., Taoyuan (TW)

(72) Inventors: Li-Kuang Tan, Taoyuan Hsien (TW); Shih-Kang Lin, Taoyuan (TW); Kuo-Ying Lee, Taoyuan (TW); Ting-Yuan Wu, Taoyuan (TW); Chao-Wen Lu, Taoyuan Hsien (TW)

(73) Assignee: DELTA ELECTRONICS, INC., Taoyuan (TW)

(*) Notice: Subject to any disclaimer, the term of this patent is extended or adjusted under 35 U.S.C. 154(b) by 0 days.

(21) Appl. No.: 16/742,203

(22) Filed: Jan. 14, 2020

(65) Prior Publication Data
US 2020/0149821 A1 May 14, 2020

Related U.S. Application Data

(63) Continuation-in-part of application No. 15/624,300, filed on Jun. 15, 2017, now Pat. No. 11,306,974.
(Continued)

(30) Foreign Application Priority Data

Jun. 6, 2017 (CN) .......................... 201710417049.0

(51) Int. Cl.
*F28D 15/02* (2006.01)
*F28D 15/04* (2006.01)
(Continued)

(52) U.S. Cl.
CPC ..... *F28D 15/0233* (2013.01); *F28D 15/0275* (2013.01); *F28D 15/04* (2013.01); *H05K 7/20336* (2013.01); *F28D 2021/0028* (2013.01); *F28F 2215/00* (2013.01); *F28F 2225/04* (2013.01)

(58) Field of Classification Search
CPC .. F28D 15/0233; F28D 15/04; F28D 15/0275; F28D 2021/0028; F28F 2225/04; F28F 2215/00; H05K 7/20336
See application file for complete search history.

(56) References Cited

U.S. PATENT DOCUMENTS 3,404,061 A * 10/1968 Bochman .................. D01F 9/12
428/143
4,040,478 A * 8/1977 Pogson ............... F28D 15/0241
165/46
(Continued)

FOREIGN PATENT DOCUMENTS

CN 2765439 Y 3/2006
CN 2770285 Y 4/2006
(Continued)

*Primary Examiner* — Ljiljana V. Ciric
(74) *Attorney, Agent, or Firm* — Muncy, Geissler, Olds & Lowe, P.C.

(57) ABSTRACT

A temperature plate device includes a plate body and a bent structure. The plate body includes a first plate and a second plate. A chamber is defined by the first plate and the second plate. The first plate has a first step section. The second plate has a second step section corresponding to the first step section. The bent structure is connected to and traverses the first step section between the first step section and the second step section.

14 Claims, 13 Drawing Sheets

Related U.S. Application Data

(60) Provisional application No. 62/350,373, filed on Jun. 15, 2016.

(51) Int. Cl.
*H05K 7/20* (2006.01)
*F28D 21/00* (2006.01)

(56) References Cited

U.S. PATENT DOCUMENTS

| | | | |
|---|---|---|---|
| 4,402,358 A * | 9/1983 | Wolf | F28D 15/04 |
| | | | 165/104.26 |
| 4,849,858 A | 7/1989 | Grapes et al. | |
| 5,343,940 A * | 9/1994 | Jean | F28D 15/0241 |
| | | | 165/104.33 |
| 5,560,423 A | 10/1996 | Larson et al. | |
| 5,769,154 A * | 6/1998 | Adkins | F28D 15/0233 |
| | | | 126/96 |
| 5,769,158 A * | 6/1998 | Yao | F28F 13/00 |
| | | | 165/185 |
| 6,056,044 A * | 5/2000 | Benson | F28D 15/0233 |
| | | | 165/104.26 |
| 6,164,368 A * | 12/2000 | Furukawa | F28D 15/0233 |
| | | | 165/104.33 |
| 6,167,948 B1 * | 1/2001 | Thomas | H01L 23/427 |
| | | | 165/104.26 |
| 6,257,328 B1 | 7/2001 | Fujiwara et al. | |
| 6,504,720 B2 * | 1/2003 | Furuya | H01L 23/427 |
| | | | 165/104.33 |
| 6,721,182 B1 | 4/2004 | Wells et al. | |
| 6,725,910 B2 * | 4/2004 | Ishida | B21C 37/151 |
| | | | 165/104.21 |
| 6,765,798 B1 | 7/2004 | Ratliff et al. | |
| 6,914,780 B1 | 7/2005 | Shanker et al. | |
| 6,997,245 B2 | 2/2006 | Lindermuth et al. | |
| 7,237,338 B2 * | 7/2007 | Lin | F28D 15/0275 |
| | | | 29/890.032 |
| 7,278,469 B2 | 10/2007 | Sasaki et al. | |
| 7,393,587 B2 | 7/2008 | Krassowski et al. | |
| 7,656,665 B2 | 2/2010 | Lin et al. | |
| 7,663,883 B2 | 2/2010 | Shirakami et al. | |
| 7,794,868 B2 | 9/2010 | Yang | |
| 7,857,037 B2 | 12/2010 | Parish et al. | |
| 7,961,467 B2 * | 6/2011 | Hongo | F28D 15/0275 |
| | | | 361/700 |
| 8,098,490 B2 | 1/2012 | Hata | |
| 8,270,166 B2 | 9/2012 | Chen | |
| 8,780,559 B2 * | 7/2014 | Weaver, Jr. | H01L 23/427 |
| | | | 361/700 |
| 8,811,014 B2 * | 8/2014 | Chauhan | H01L 23/427 |
| | | | 361/700 |
| 9,429,370 B1 | 8/2016 | Thomsen et al. | |
| 9,625,215 B2 * | 4/2017 | Hsiao | F28D 15/04 |
| 10,458,716 B2 | 10/2019 | Hulse et al. | |
| 10,517,192 B2 * | 12/2019 | Hsiao | F28D 15/0233 |
| 10,619,941 B2 * | 4/2020 | Huang | F28F 3/12 |
| 10,670,650 B2 * | 6/2020 | Wolff | F28D 15/0275 |
| 10,739,081 B2 * | 8/2020 | Zhou | B23P 15/26 |
| 10,973,151 B2 * | 4/2021 | Wakaoka | F28D 15/0233 |
| 2001/0047859 A1 | 12/2001 | Ishida et al. | |
| 2002/0062648 A1 * | 5/2002 | Ghoshal | F28D 15/0233 |
| | | | 62/3.7 |
| 2003/0024691 A1 * | 2/2003 | Tsay | F28D 15/0233 |
| | | | 165/104.26 |
| 2005/0092465 A1 * | 5/2005 | Lin | H01L 21/4882 |
| | | | 165/104.21 |
| 2005/0173096 A1 * | 8/2005 | Hsu | F28D 15/0233 |
| | | | 165/104.21 |
| 2006/0144561 A1 | 7/2006 | Lin et al. | |
| 2006/0144571 A1 | 7/2006 | Lin et al. | |
| 2007/0068657 A1 | 3/2007 | Yamamoto et al. | |
| 2007/0127210 A1 | 6/2007 | Mahalingam et al. | |
| 2008/0066891 A1 | 3/2008 | Jeng | |
| 2008/0198554 A1 | 8/2008 | Holmberg et al. | |
| 2008/0210407 A1 | 9/2008 | Kim et al. | |
| 2008/0291630 A1 | 11/2008 | Monh et al. | |
| 2008/0292949 A1 * | 11/2008 | Shen | F28D 15/0266 |
| | | | 429/120 |
| 2009/0014160 A1 | 1/2009 | Hsiao | |
| 2009/0071632 A1 | 3/2009 | Bryant et al. | |
| 2010/0084113 A1 | 4/2010 | Lee | |
| 2010/0195280 A1 | 8/2010 | Huang et al. | |
| 2010/0309671 A1 | 12/2010 | Meyer, IV et al. | |
| 2011/0048679 A1 * | 3/2011 | Hsieh | F28D 15/0233 |
| | | | 165/104.26 |
| 2011/0088873 A1 * | 4/2011 | Yang | F28D 15/0233 |
| | | | 165/104.26 |
| 2011/0088874 A1 | 4/2011 | Meyer, IV et al. | |
| 2011/0100608 A1 * | 5/2011 | Huang | F28D 15/046 |
| | | | 165/104.26 |
| 2011/0103017 A1 | 5/2011 | Yu et al. | |
| 2011/0240258 A1 * | 10/2011 | Yang | H01L 23/427 |
| | | | 165/67 |
| 2011/0315359 A1 | 12/2011 | Shih et al. | |
| 2012/0085518 A1 | 4/2012 | Ichkahn et al. | |
| 2012/0160456 A1 | 6/2012 | Aoki | |
| 2013/0118717 A1 * | 5/2013 | Lin | F28D 15/0233 |
| | | | 165/104.26 |
| 2013/0188717 A1 | 5/2013 | Lin et al. | |
| 2013/0168050 A1 | 7/2013 | Chauhan et al. | |
| 2013/0233518 A1 | 9/2013 | Liu et al. | |
| 2013/0233520 A1 | 9/2013 | Lo et al. | |
| 2013/0299213 A1 * | 11/2013 | Li | H01L 23/427 |
| | | | 174/252 |
| 2014/0060780 A1 | 3/2014 | Moon | |
| 2014/0131013 A1 | 5/2014 | Horng | |
| 2014/0138056 A1 | 5/2014 | Horng | |
| 2014/0182817 A1 | 7/2014 | Yu | |
| 2014/0360701 A1 | 12/2014 | Aoki et al. | |
| 2015/0114603 A1 | 4/2015 | Pai | F28D 15/0233 |
| | | | 165/104.26 |
| 2015/0114604 A1 * | 4/2015 | Pai | F28D 15/046 |
| | | | 165/104.26 |
| 2015/0189792 A1 | 7/2015 | Kenna et al. | |
| 2015/0258643 A1 | 9/2015 | Lin et al. | |
| 2015/0260388 A1 | 9/2015 | Geels et al. | |
| 2016/0132081 A1 | 5/2016 | Wu | |
| 2017/0080533 A1 | 3/2017 | Lin et al. | |
| 2017/0082377 A1 | 3/2017 | Lin et al. | |
| 2017/0284738 A1 * | 10/2017 | Watanabe | F28F 9/0131 |
| 2018/0010861 A1 | 1/2018 | Wakaoka et al. | |
| 2018/0017334 A1 | 1/2018 | Davis | |
| 2018/0023416 A1 | 1/2018 | Riaz et al. | |
| 2019/0162481 A1 | 5/2019 | Machida | |
| 2019/0293360 A1 | 9/2019 | McGlen et al. | |
| 2020/0100390 A1 * | 3/2020 | Koo | F28D 15/046 |
| 2020/0124352 A1 * | 4/2020 | Wakaoka | H01L 23/427 |
| 2020/0182556 A1 * | 6/2020 | Liu | F28D 15/04 |
| 2020/0221605 A1 * | 7/2020 | Vanderwees | G06F 1/203 |
| 2020/0236810 A1 * | 7/2020 | Wakaoka | F28D 15/046 |
| 2020/0248968 A1 * | 8/2020 | Chen | F28D 15/046 |
| 2020/0326131 A1 * | 10/2020 | Hikichi | F28D 15/0275 |
| 2020/0326134 A1 * | 10/2020 | Chen | F28D 15/0233 |
| 2020/0333082 A1 * | 10/2020 | Wakaoka | F28D 15/04 |

FOREIGN PATENT DOCUMENTS

| | | |
|---|---|---|
| CN | 201207780 Y | 3/2009 |
| CN | 203337002 U | 12/2013 |

* cited by examiner

TEMPERATURE PLATE DEVICE

CROSS REFERENCE TO RELATED APPLICATIONS

This Non-provisional application is a Continuation-In-Part (CIP) application of U.S. application Ser. No. 15/624,300, which claims priority to U.S. provisional patent application with Ser. No. 62/350,373 filed on Jun. 15, 2016 and claims priority under 35 U.S.C. § 119(a) on Patent Application No(s). 201710417049.0 filed in People's Republic of China on Jun. 6, 2017. This and all other extrinsic materials discussed herein are incorporated by reference in their entirety.

BACKGROUND OF THE DISCLOSURE

Field of Disclosure

The present disclosure relates to a temperature plate and a heat dissipation device. In particular, the present disclosure relates to a temperature plate with a bent structure and a heat dissipation device having a cooling fin assembly clipped by the bent structure.

Related Art

In general, the temperature plate is composed by metal plates by welding or assembling. The temperature plate has a vacuum chamber and is a high performance heat dissipation device for rapidly transferring heat from the heat source to a large dissipating surface. Accordingly, the heat dissipation device adapted with the temperature plate has been widely applied to various high-performance commercial devices, such as dissipating heat of servers, communication apparatuses, or high-performance LED (high-performance light-emitting diode).

In order to enhance the heat dissipating efficiency of the temperature plate, it is generally to bend the plate body of the temperature plate, so that the bent plate body can have a larger surface to be contacted with the cooling fin assembly or heat source. However, when applying a force to bend the plate body, the bent portion of the plate body usually has a depression or deformation, so as to decrease contact surface. Therefore, it is desired to eliminate or decrease the depression or deformation of the bent portion of the plate body.

SUMMARY OF THE DISCLOSURE

The present disclosure provides a temperature plate device including a plate body and a bent structure. The plate body includes a first plate and a second plate. A chamber is defined by the first plate and the second plate. The first plate has a first step section. The second plate has a second step section corresponding to the first step section. The bent structure is connected to and traverses the first step section between the first step section and the second step section.

In one embodiment, a gap is between the bent structure and the second step section.

In one embodiment, the first plate includes two flat sections at different horizontal planes. The first step section is connected with the two flat sections of the first plate. The second plate includes two flat sections at different horizontal planes, and the second step section is connected with the two flat sections of the second plate.

In one embodiment, the first step section has a slope line portion between the two flat sections of the first plate. Two ends of the first step section are bent and respectively connected with the two flat sections of the first plate. The second step section has a slope line portion between the two flat sections of the second plate. Two ends of the second step section are bent and respectively connected with the two flat sections of the second plate.

In one embodiment, when viewing the bent structure along a direction which is perpendicular to an extending direction of the first plate, the bent structure is a stripe.

In one embodiment, one end of the bent structure is a rectangle, a semi-circle, a triangle, a curve, or an irregular shape.

In one embodiment, the first plate and the bent structure are made by a single plate workpiece.

In one embodiment, the temperature plate device further includes a plurality of unbent structures on the first plate between the first plate and the second plate beyond the bent structure.

In one embodiment, the temperature plate device further includes a wick structure on the second plate between the unbent structures and the second plate beyond the bent structure.

In one embodiment, no wick structure is between the bent structure and the second step section.

In one embodiment, the temperature plate device includes a plurality of the bent structures, a distance between any two adjacent ones of the bent structures is equal or different.

The present disclosure provides a temperature plate device including a first plate, a second plate and a bent structure. The first plate includes two flat sections at different horizontal planes and a first step section being connected with the two flat sections of the first plate. The second plate includes two flat sections at different horizontal planes and a second step section being connected with the two flat sections of the second plate corresponding to the first step section. A chamber is defined by the first plate and the second plate. The bent structure is connected to and traverses the first step section between the first step section and the second step section. A gap is between the bent structure and the second step section. The bent structure is a stripe when viewing the bent structure along a direction which is perpendicular to an extending direction of the first plate.

In one embodiment, the first step section has a slope line portion between the two flat sections of the first plate. Two ends of the first step section are bent and respectively connected with the two flat sections of the first plate. The second step section has a slope line portion between the two flat sections of the second plate. Two ends of the second step section are bent and respectively connected with the two flat sections of the second plate.

In one embodiment, one end of the bent structure is a rectangle, a semi-circle, a triangle, a curve, or an irregular shape.

In one embodiment, the first plate and the bent structure are made by a single plate workpiece.

In one embodiment, the temperature plate device further includes a plurality of unbent structures on the first plate between the first plate and the second plate beyond the bent structure.

In one embodiment, the temperature plate device further includes a wick structure on the second plate between the unbent structures and the second plate beyond the bent structure.

In one embodiment, no wick structure is between the bent structure and the second step section.

In one embodiment, the temperature plate device includes a plurality of the bent structures, a distance between any two adjacent ones of the plurality of the bent structures is equal or different.

As mentioned above, the bent structure is at the step sections of the plates in the temperature plate device, and traverses the first step section between the first step section and the second step section. The bent structure can be stripe. Thus, the length of the bent structure covers the entire length of the step section. The first plate or the second plate is effectively supported by the bent structure to avoid collapse.

In addition, in some embodiments, a gap is between the bent structure and the second plate. For example, the gap is 0.1 mm-0.2 mm. Thus, when pressing the temperature plate device to form the step sections of the first and second plates, the first and second plates still have some freedom to avoid collapse caused from material stretch. The performance of the temperature plate device is maintained. Further, it is possible that no wick structure is in this gap. It is also possible that a wick structure is in this gap.

BRIEF DESCRIPTION OF THE DRAWINGS

The present disclosure will become more fully understood from the subsequent detailed description and accompanying drawings, which are given by way of illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1A:
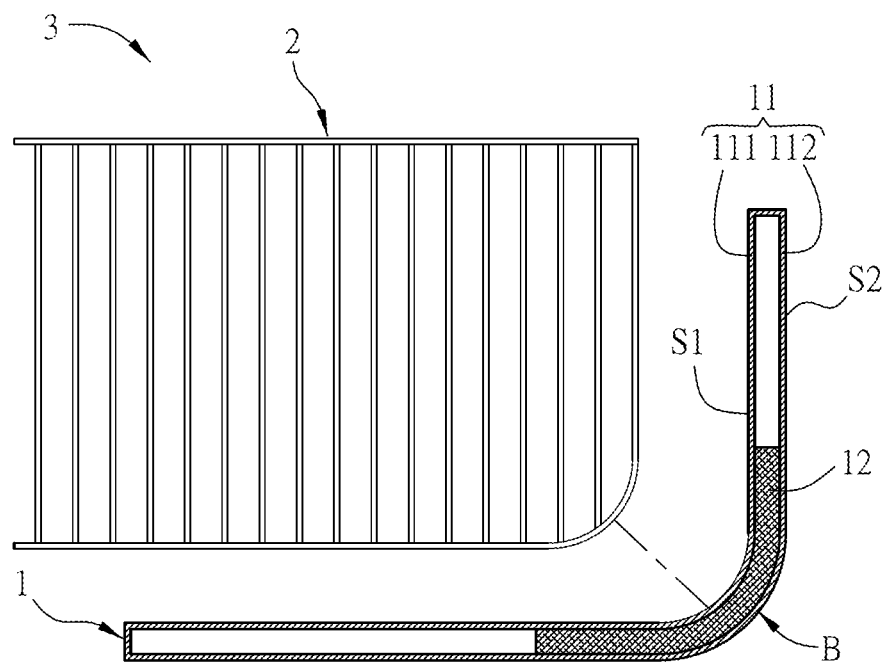
FIGS. 1A and 1B are an exploded view and an assembled view of a heat dissipation device according to an embodiment of the disclosure, respectively.
Figure 1B:
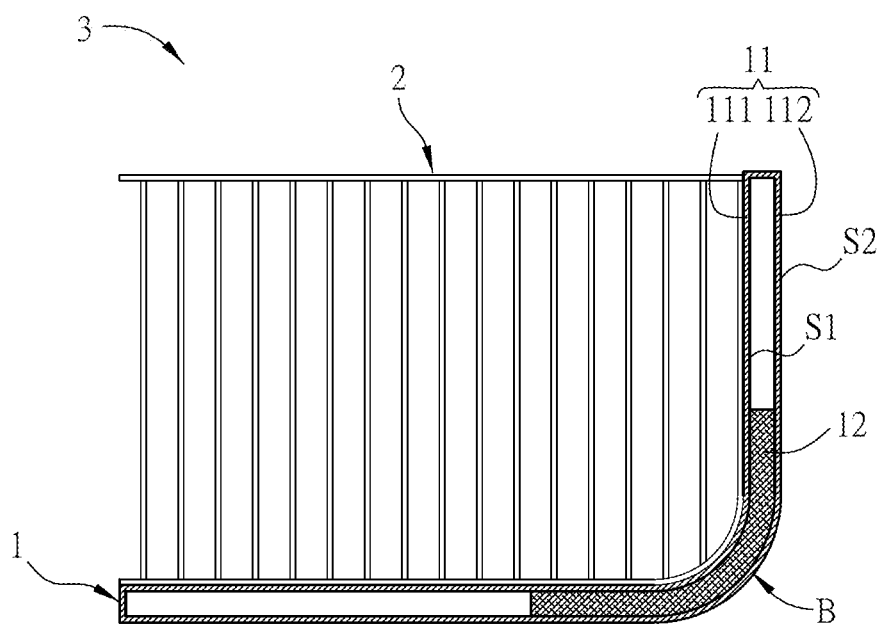

FIGS. 1A and 1B are an exploded view and an assembled view of a heat dissipation device 3 according to an embodiment of the disclosure, respectively.

Referring to FIGS. 1A and 1B, the heat dissipation device 3 includes at least one temperature plate 1 and a cooling fin assembly 2, which are cooperated with and connected to each other.

The temperature plate 1 is also known as a thermal conducting plate. In this embodiment, the temperature plate 1 has a vacuum chamber, and has a wick structure disposed on the inner wall of the vacuum chamber. Besides, a working fluid is filled into the vacuum chamber. When the bottom of the heat dissipation device 3 is contacted with a heat source, the heat energy can be conducted to the temperature plate 1 and the working fluid inside the temperature plate 1 will be evaporated to gaseous state. The gaseous state working fluid can carry the heat energy through the wick structure and then toward outside of the temperature plate 1, and then the heat energy can be dissipated to the environment through the cooling fin assembly 2, which is connected to and contacted with the temperature plate 1. Afterwards, the gaseous state working fluid is cooled down and condensed to liquid state working fluid, which will flow back via the wick structure. Thus, the working fluid can be cyclically flowing in the vacuum chamber.

Figure 2A:
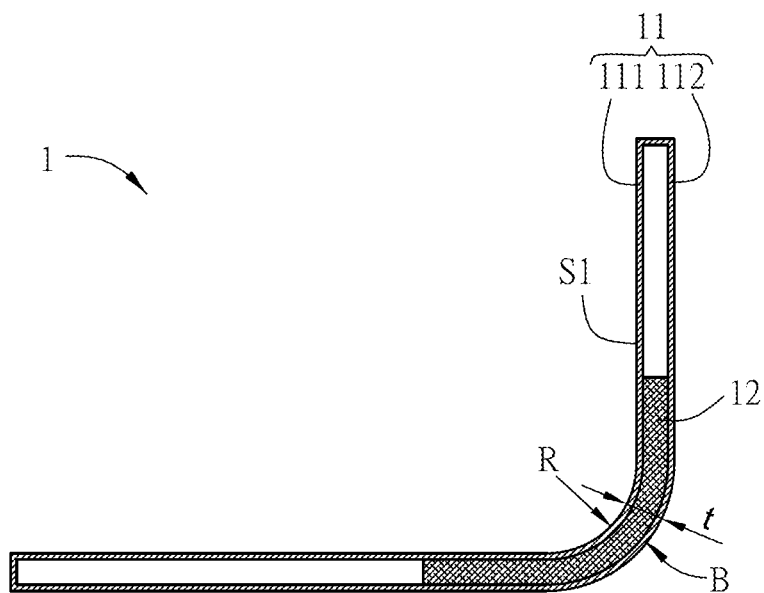
FIGS. 2A and 2B are different side views of the temperature plate according to an embodiment of the disclosure.
Figure 2B:
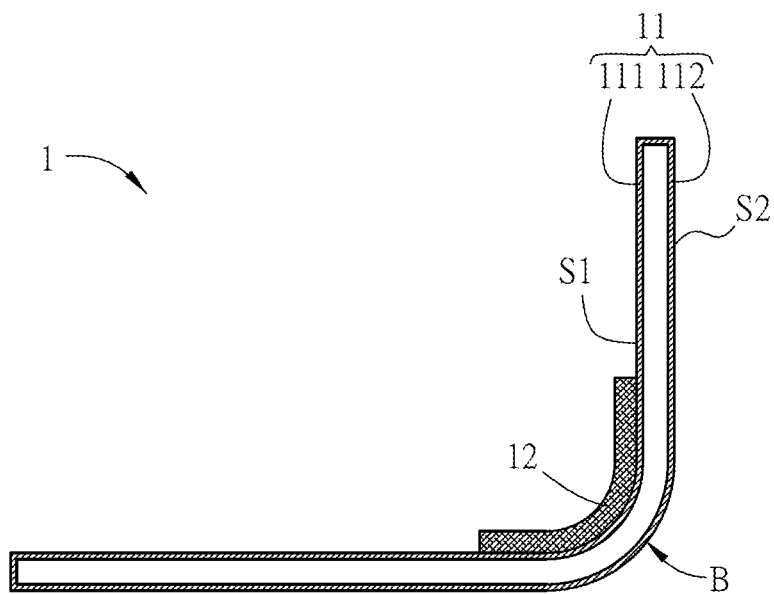

FIGS. 2A and 2B are different side views of the temperature plate 1 according to an embodiment of the disclosure. In this embodiment, the temperature plate 1 includes a plate body 11, which is made of a metal material having a high heat transfer coefficient. The plate body 11 can be formed by a first plate 111 and a second plate 112, which are connected by, for example but not limited to, welding for forming or defining a vacuum chamber therebetween. Of course, the plate body 11 can also be made by folding, assembling, or bonding a single plate workpiece, and this disclosure is not limited. The plate body 11 has a first surface S1, and the first surface S1 of the plate body 11 is compressed when bending the plate body 11. In other words, the first surface S1 is as the compressive side when bending the plate body 11 to form at least one bent portion B. In this embodiment, the plate body 11 is bent to the left side (FIG. 1A) to form a bent portion B, and the plate body 11 thus has a reversed L shape. Herein, the left side is the compressive side. To be noted, the first surface S1 can be a tensile side when bending the plate body 11, which means the plat body is bent to the opposite side, the right side, as shown in FIG. 1A. As shown in FIG. 2A, a curvature radius R of the bent portion B of the plate body 11 is at least twice of a thickness t of the bent portion B (R≥2t).

In the conventional art, when applying a force to bend the plate body of the temperature plate, it is discovered that the bent portion of the plate body has undesired depression or deformation, which can destroy the wick structure configured on the inner wall of the plate body. This can cause a non-smooth or discontinuous (wick) structure surface so as to decrease the heat dissipating efficiency of the temperature plate. In order to prevent the undesired depression or deformation, the temperature plate 1 of this disclosure further includes at least one supporting structure 12 disposed corresponding to the bent portion B. In this embodiment, the supporting structure 12 is disposed inside the vacuum chamber of the temperature plate 1. The supporting structure 12 can be a structural enhancement member, such as a metal unit, connecting to inner wall of the vacuum chamber and disposed corresponding to the bent portion B. The metal unit can be, for example but not limited to, a copper bar (sheet) or aluminum bar (sheet), and the supporting structure 12 can be connected to the bent portion B by welding or assembling. The supporting structure 12 can be made of the same material as the wick structure, and this disclosure is not limited. The supporting structure 12 can enhance the structural strength of the bent portion B so as to prevent the depression or deformation of the plate body 11 when bending the plate body 11 and also to improve the heat conduction.

In some embodiments, as shown in FIG. 2B, the supporting structure 12 can be a structural enhancement member (e.g. a metal unit) and connected to the first surface S1 of the first plate 111 (at which) corresponding to the bent portion B. In another embodiment, the supporting structure 12 can be disposed on the second surface S2 of the second plate 112 corresponding to the bent portion B (not shown).

Figure 2C:
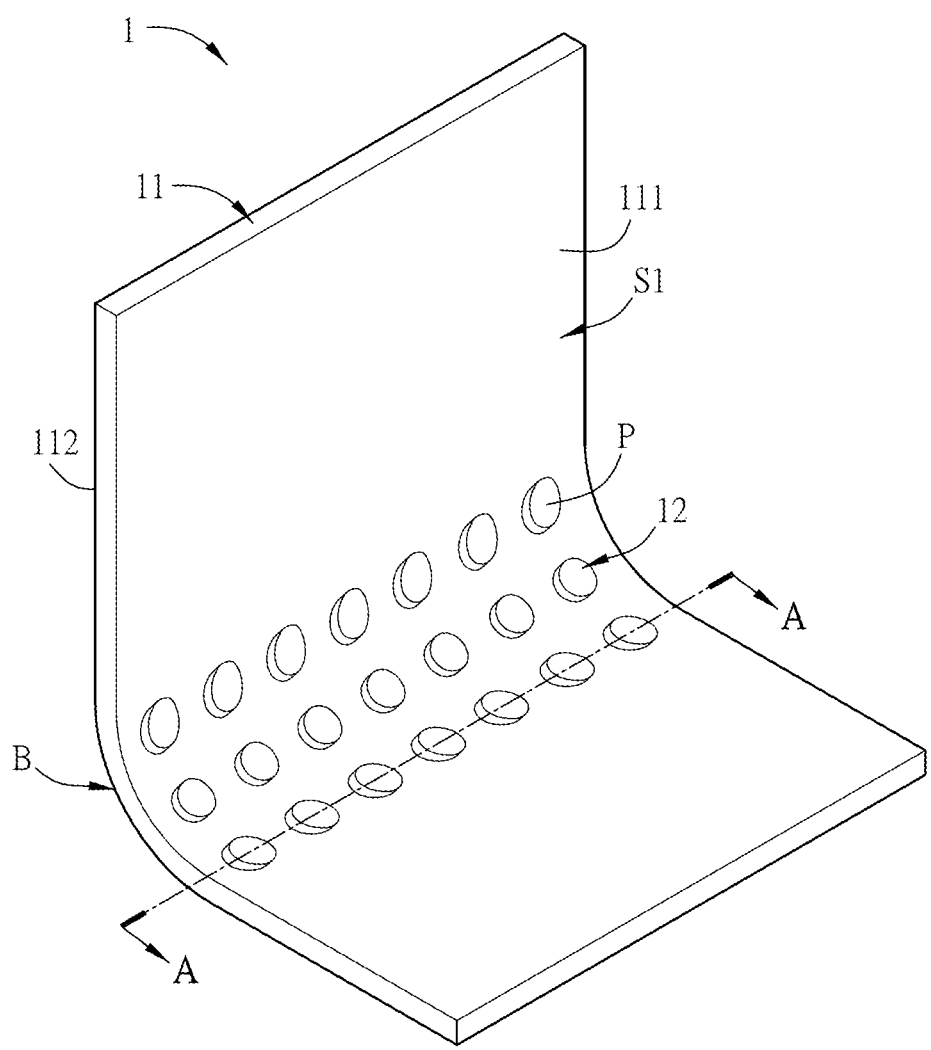
FIGS. 2C and 2D are perspective views of the temperature plates according to different aspects of the disclosure.
Figure 2D:
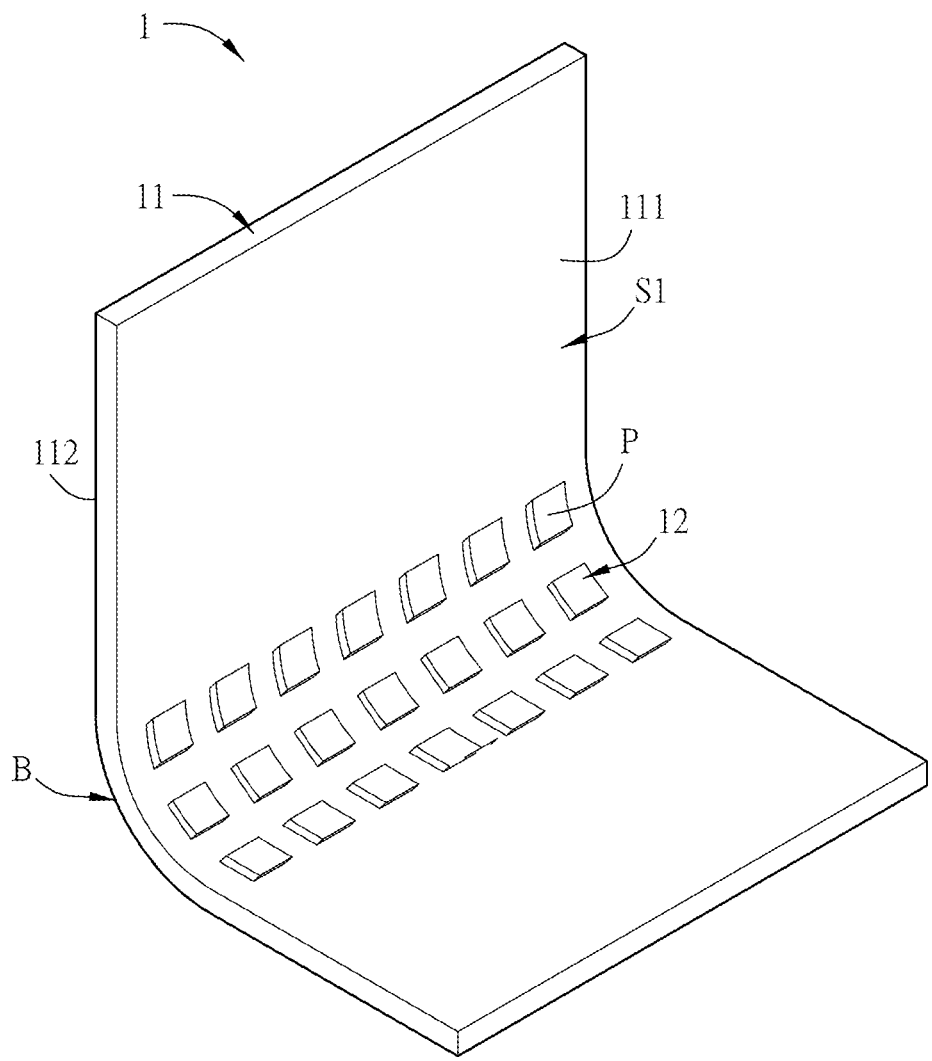

In some embodiments, it is also possible to enhance the structural strength of the bent portion B by constructing the supporting structure 12 corresponding to the bent portion B and the adjacent part directly. In other words, the part of the first plate 111 or the second plate 112 corresponding to the bent portion B can be processed to increase the structural strength of the bent portion B. FIGS. 2C and 2D are perspective views of the temperature plates according to different aspects of the disclosure. As shown in FIGS. 2C and 2D, a part of the first plate 111 (or the second plate 112) corresponding to the bent portion B is configured with a plurality of protruding portions P or recess portions (not shown) for constructing the supporting structure 12. In other words, the part of the first plate 111 (or the second plate 112) corresponding to and adjacent to the bent portion B can be processed to generate a plurality of protruding portions P (or recess portions), which can enhance the structural strength of the bent portion B and the adjacent part. This configuration can prevent the undesired depression or deformation when bending the plate body 11. In this embodiment, the protruding portions P can be cylindrical pillars (FIG. 2C) or square pillars (FIG. 2D) or any other suitable shape, or their combinations. In the embodiment of FIGS. 2C and 2D, the protruding portions P are aligned to each other. Of course, this disclosure is not limited thereto. In other embodiments, the protruding portions P are misaligned or arranged irregularly to each other. In addition, the part of the first plate 111 and the part of the second plate 112 corresponding to and adjacent to the bent portion B are both configured with protruding portions P (or recess portions). This configuration can also enhance the structural strength of the bent portion B and the adjacent part.

Figure 2E:
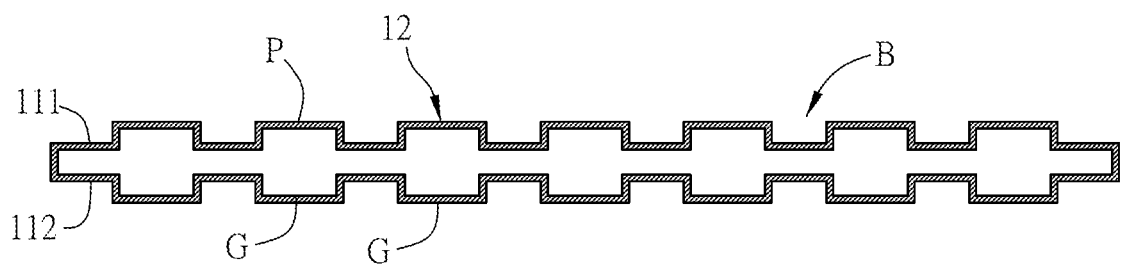
FIG. 2E is a sectional view of FIG. 2C along the line A-A.
Figure 2F:
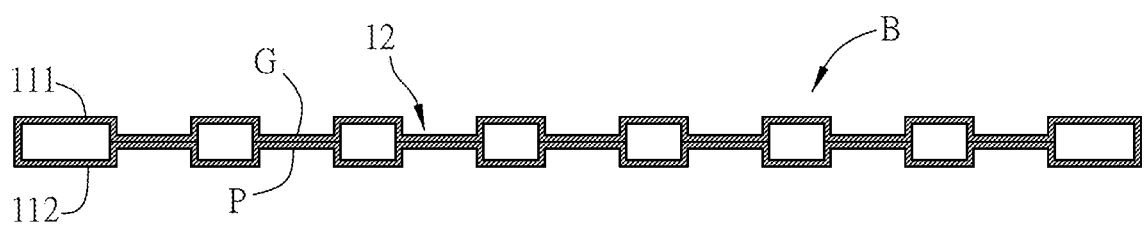
FIGS. 2F and 2G are schematic diagrams showing the protruding portions and/or recess portions of the first plate and the second plate according to different aspects of the disclosure, respectively.
Figure 2G:
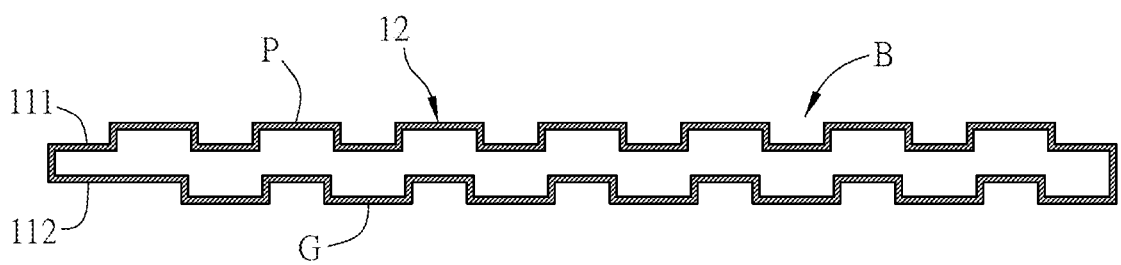

FIG. 2E is a sectional view of FIG. 2C along the line A-A, and FIGS. 2F and 2G are schematic diagrams showing the protruding portions and/or recess portions of the first plate 111 and the second plate 112 according to different aspects of the disclosure, respectively. As shown in FIGS. 2E to 2G, the protrusions of the plates are the protruding portions, and the recesses of the plates are recess portions.

In some embodiments, one of the first plate 111 and the second plate 112 has a plurality of protruding portions P corresponding to the bent portion B, and the other of the first plate 111 and the second plate 112 has a plurality of recess portions G corresponding to the bent portion B. The protruding portions P and the recess portions G construct the supporting structure 12, and the protruding portions P can be aligned or misaligned to the recess portions G. As shown in FIG. 2E, the part of the first plate 111 corresponding to and adjacent to the bent portion B includes a plurality of protruding portions P, and the part of the second plate 112 corresponding to and adjacent to the bent portion B includes a plurality of recess portions G. The protruding portions P and the recess portions G construct the supporting structure 12, and the protruding portions P are aligned to the recess portions G.

As shown in FIG. 2F, the part of the first plate 111 corresponding to and adjacent to the bent portion B includes a plurality of recess portions G, and the part of the second plate 112 corresponding to and adjacent to the bent portion B includes a plurality of protruding portions P. The recess portions G and the protruding portions P construct the supporting structure 12, and the recess portions G are aligned to the protruding portions P.

As shown in FIG. 2G, the part of the first plate 111 corresponding to and adjacent to the bent portion B includes a plurality of protruding portions P, and the part of the second plate 112 corresponding to and adjacent to the bent portion B includes a plurality of recess portions G. The protruding portions P and the recess portions G construct the supporting structure 12, and the protruding portions P are misaligned to the recess portions G. The above mentioned aspects of the first plates 111, second plates 112, supporting structures 12, protruding portions P and recess portions G are for illustrations only and are not for limiting the scope of this disclosure.

As mentioned above, in order to enhance the structural strength of the bent portion B and to prevent the depression or deformation of the bent plate body 11, the supporting structure 12 is provide in the vacuum chamber of the plate body 11 or on the first surface S1 of the first plate 111 or on the second surface S2 of the second plate 112 of the plate body 11. In addition, the plate body 11 can be processed to form protruding portions P and/or recess portions G corresponding to and adjacent to the bent portion B for constructing the supporting structure 12 to enhance the structural strength of the bent portion B and adjacent part, and to prevent the depression or deformation when bending the plate body 11. Moreover, inner wall of the plate body 11 can be configured with a wick structure for improving the heat dissipation efficiency. The wick structure can be configured based on the shape or trend of the protruding portions P or the recess portions G. Thus, inner wall of the plate body 11 is configured with a continuous wick structure.

Referring to FIGS. 1A and 1B, the cooling fin assembly 2 is disposed at the compressive side and contacted with the first surface S1 of the plate body 11. In this embodiment, the bent portion B can divide the first surface S1 of the plate body 11 into a plurality of regions, and the cooling fin assembly 2 is contacted with at least two of the regions. In more detailed, the heat dissipation device 3 of the embodiment has only one bent portion B, and the first surface S1 of the plate body 11 (excluding the bent portion B) is divided into two parts, including a vertical part and a horizontal part of the plate body 11. The cooling fin assembly 2 is contacted with both of the two parts, and it may contact with a part of the bent portion B under proper conditions. Accordingly, the heat transmitted to the temperature plate 1 can be delivered to the cooling fin assembly 2 through first surface S1 of the bent plate body 11, so that the heat energy can be dissipated to environment via the cooling fin assembly 2. Thus, the heat dissipation device 3 of the embodiment can prevent the undesired depression or deformation while bending plate body 11 of the temperature plate 1, and can provide more conducting paths and a larger contact surface between the temperature plate 1 and the cooling fin assembly 2 via the bent portion B at the first surface S1, thereby improving the heat dissipating efficiency.

Figure 3:
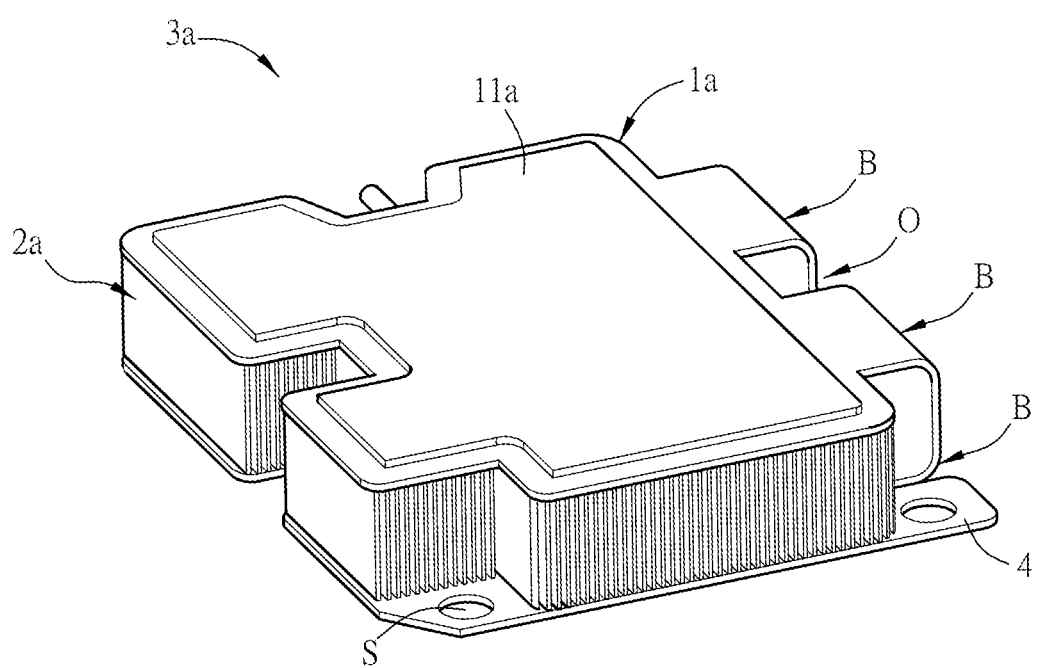
FIGS. 3 and 4 are perspective views of the heat dissipation devices according to different embodiments of the disclosure.
Figure 4:
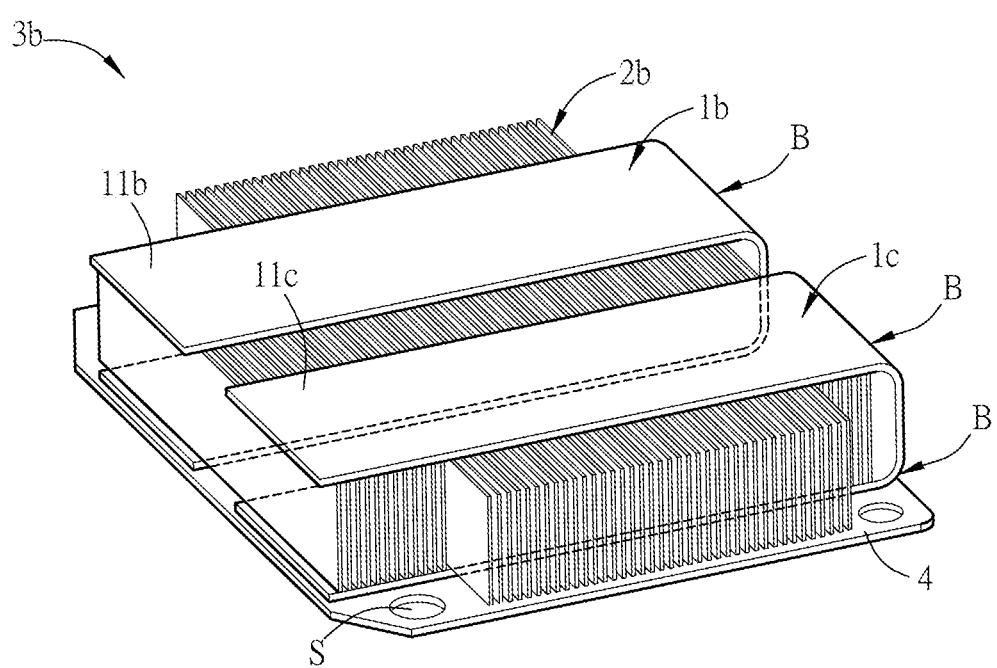

FIGS. 3 and 4 are perspective views of the heat dissipation devices 3a and 3b according to different embodiments of the disclosure.

Different from the heat dissipation device 3 of FIG. 1B, a heat dissipation device 3a of this embodiment as shown in FIG. 3 includes two bent portions B, so that the plate body 11a of the temperature plate 1a has a laid U shape structure.

The supporting structure (not shown) is disposed corresponding to the bent portion B. In more detailed, two supporting structures are disposed inside the vacuum chamber of the temperature plate 1a and located corresponding to the two bent portions B, respectively. Of course, the two supporting structures can also be disposed on the first surface or the second surface of the plate body 11a corresponding to configurations of the bent portions B. The configuration of the two bent portions B allows the bent plate body 11a to clip the cooling fin assembly 2a. The cooling fin assembly 2a contacts to the inner surface of the laid U-shaped plate body 11a. In this case, the cooling fin assembly 2a contacts to the inner top surface and the inner bottom surface of the plate body 11a, which are disposed adjacent to the bent portions B and are both not bent, i.e., they are flat portions. The part of the plate body 11a between the two bent portions B is not contacted with the cooling fin assembly 2a. Of course, in other embodiments, the cooling fin assembly 2a may contact to the part of the plate body 11a between the two bent portions B. In addition, the plate body 11a may further have an opening O corresponding to the bent portions B for installing additional components, such as a fixing member or a heat pipe.

In addition, the heat dissipation device 3a further includes a heat conducting plate 4. The heat conducting plate 4 can be made of metal or other high heat conducting material, which can be the same or different from the material of the temperature plate 1a and/or the cooling fin assembly 2a. In this embodiment, the temperature plate 1a and the cooling fin assembly 2a are disposed on the heat conducting plate 4. When the heat source (not shown) contacts to bottom surface of the heat conducting plate 4, the heat energy can be transferred to the temperature plate 1a and the cooling fin assembly 2a via the heat conducting plate 4 and then dissipated to the environment through the temperature plate 1a and the cooling fin assembly 2a. In addition, the heat conducting plate 4 may have at least a screw hole or a fastening hole S for assembling with the external heating component.

Different from the heat dissipation device 3a of FIG. 3, a heat dissipation device 3b of this embodiment as shown in FIG. 4 includes two temperature plates 1b and 1c. Each of the temperature plates 1b and 1c has two bent portions B, so that each of the plate bodies 11b and 11c of the temperature plates 1b and 1c has a U shape structure. The supporting structure (not shown) is disposed corresponding to the bent portion B. In this case, four supporting structures are disposed inside the vacuum chambers of the temperature plates 1b and 1c and be located corresponding to the four bent portions B. Of course, the four supporting structures can also be disposed on the surfaces of the plate bodies 11b and 11c corresponding to the bent portions B. The bent plate bodies 11b and 11c can together clip the cooling fin assembly 2b, and the cooling fin assembly 2b contacts to inner surfaces of the laid U-shaped plate bodies 11b and 11c. In this embodiment, the cooling fin assembly 2b contacts to inner top surfaces and inner bottom surfaces of the plate bodies 11b and 11c, which are disposed adjacent to the bent portions B and are not bent, i.e., they are flat portions. The parts of the plate bodies 11b and 11c between the bent portions B are not contacted with the cooling fin assembly 2b. Of course, in other embodiments, the cooling fin assembly 2b may contact to the parts of the plate bodies 11b and 11c between the bent portions B, and this disclosure is not limited. In addition, the temperature plates 1b and 1c and the cooling fin assembly 2b are disposed on the heat conducting plate 4. When the heat source contacts to bottom surface of the heat conducting plate 4, the heat energy can be transferred to the temperature plates 1b and 1c and the cooling fin assembly 2b via the heat conducting plate 4 and then dissipated to the environment through the temperature plates 1b and 1c and the cooling fin assembly 2b.

The other technical features of the heat dissipation devices 3a and 3b (e.g. the temperature plates 1b and 1c and the heat conducting plate 4) can be referred to the heat dissipation devices 3 in the previous embodiment, so the detailed descriptions thereof will be omitted.

To sum up, in the temperature plate and heat dissipation device of the disclosure, the supporting structure is disposed corresponding to the bent portion of the plate body of the temperature plate for enhancing the structural strength of the bent portion. This configuration can prevent the depression or deformation of the temperature plate when bending the temperature plate. In addition, the cooling fin assembly is disposed at the compressive side of the bent plate body and contacted with the first surface of the plate body, so that more conducting paths and a larger contact surface can be provided between the temperature plate and the cooling fin assembly through the bent portion, thereby improving the heat dissipating efficiency.

Figure 5A:
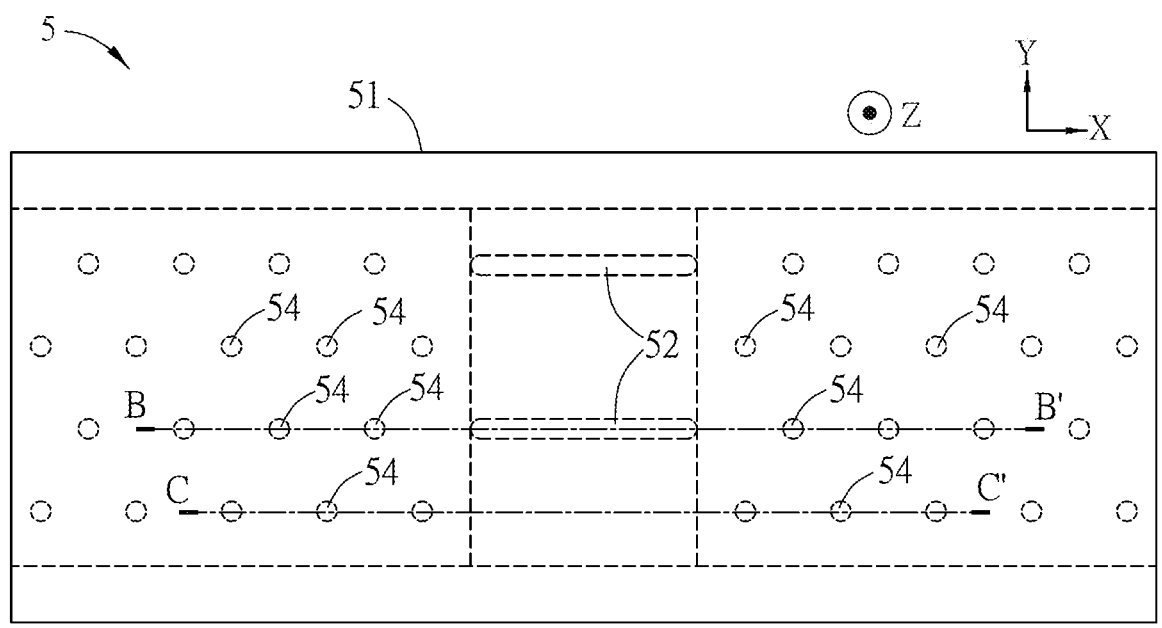
FIG. 5A is a top view of a temperature plate device according to an embodiment.
Figure 5B:
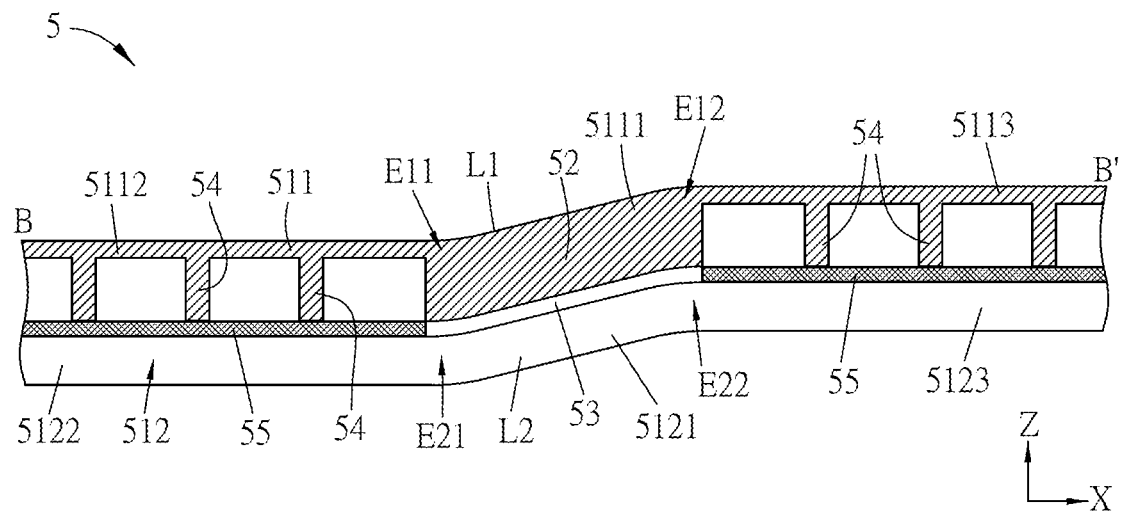
FIG. 5B is a sectional view of FIG. 5A along the line B-B'.
Figure 5C:
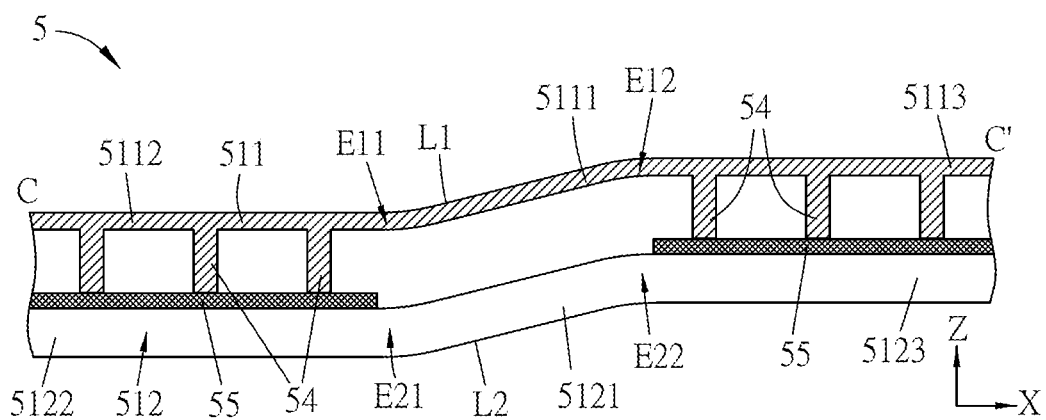
FIG. 5C is a sectional view of FIG. 5A along the line C-C'.

Referring to FIGS. 5A-5C, FIG. 5A is a top view of a temperature plate device according to an embodiment. FIG. 5B is a sectional view of FIG. 5A along the line B-B'. FIG. 5C is a sectional view of FIG. 5A along the line C-C'.

A temperature plate device 5 including a plate body 51 and a bent structure 52. The plate body 51 includes a first plate 511 and a second plate 512. A chamber is defined by the first plate 511 and the second plate 512. The first plate 511 has a first step section 5111. The second plate 512 has a second step section 5121 corresponding to the first step section 5111. The bent structure 52 is connected to and traverses the first step section 5111 between the first step section 5111 and the second step section 5121. A gap 53 is between the bent structure 52 and the second step section 5121.

The first plate 511 includes two flat sections 5112, 5113 at different horizontal planes. The first step section 5111 is connected with the two flat sections 5112, 5113. The second plate 512 includes two flat sections 5122, 5123 at different horizontal planes, and the second step section 5121 is connected with the two flat sections 5122, 5123.

The first step section 5111 has a slope line portion L1 between the two flat sections 5112, 5113. Two ends E11, E12 of the first step section 5111 are bent and respectively connected with the two flat sections 5112, 5113. The second step section 5121 has a slope line portion L2 between the two flat sections 5122, 5123. Two ends E21, E22 of the second step section 512 are bent and respectively connected with the two flat sections 5122, 5123. The first plate 511 and the bent structure 52 may be made by a single plate workpiece. The temperature plate device includes a plurality of the bent structures 52. A distance between any two adjacent ones of the bent structures 52 along direction Y is equal or different.

The first plate 511 and the second plate 512 originally can be flat plates. Then the first step section 5111 and the second step section 5121 are formed by pressing. The first plate or the second plate is effectively supported by the bent structure to avoid collapse. The gap 53 for example is 0.1 mm-0.2 mm. Thus, when pressing the temperature plate device to form the step sections of the first and second plates, the first and second plates still have some freedom to avoid collapse caused from material stretch. The performance of the temperature plate device is maintained.

The temperature plate device 5 further includes a plurality of unbent structures 54 on the first plate 511 between the first plate 511 and the second plate 52 beyond the bent structure 52. The first plate 511, the bent structure 52 and the unbent structures 54 may be made by a single plate workpiece.

The temperature plate device 5 further includes a wick structure 55 on the second plate 512 between the unbent structures 54 and the second plate 512 beyond the bent structure 52. In FIGS. 5A-5C, no wick structure is between the bent structure 52 and the second step section 5121. The gap 53 is empty. At the entire second step section 5121, there is no wick structure. In the temperature plate device 5a of FIGS. 6A-6C, a wick structure 56 is at the gap 53 between the bent structure 52 and the second step section 5121. The wick structure 56 can be connected to the wick structure 55. The wick structure 56 can occupy the entire second step section 5121. The wick structures 55 and 56 can be formed together. In another example, the wick structure 56 may only between the bent structure 52 and the second step section 5121. Beyond the bent structure 52, there is no wick structure between the first step section 5111 and the second step section 5121.

Figure 6A:
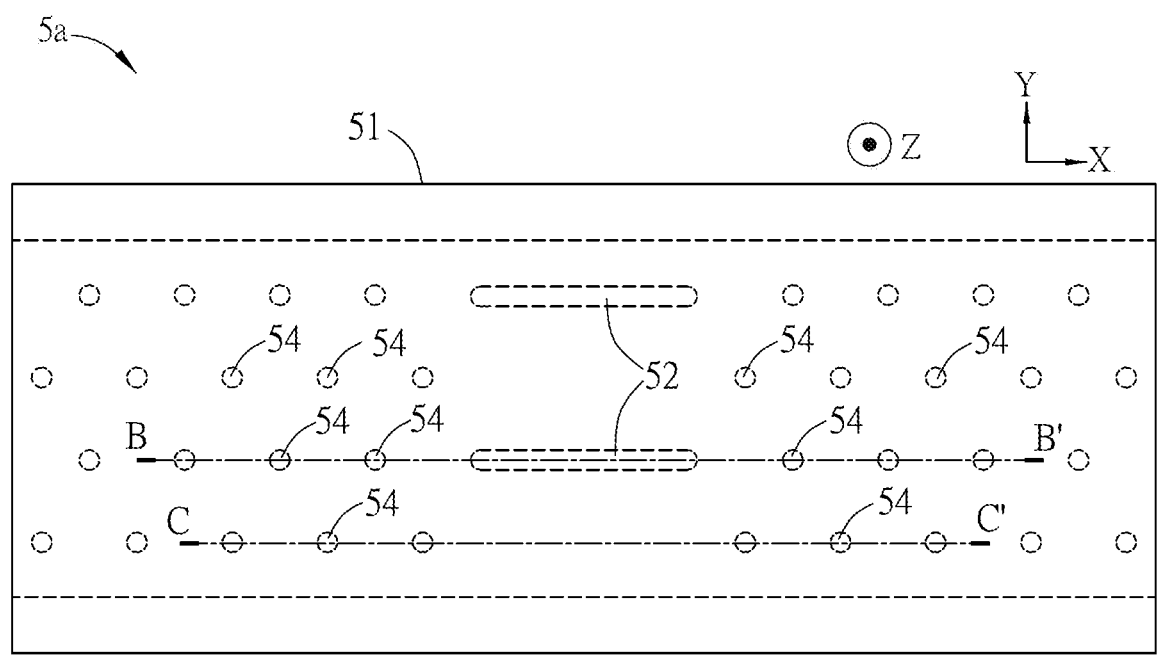
FIG. 6A is a top view of a temperature plate device according to an embodiment.
Figure 6B:
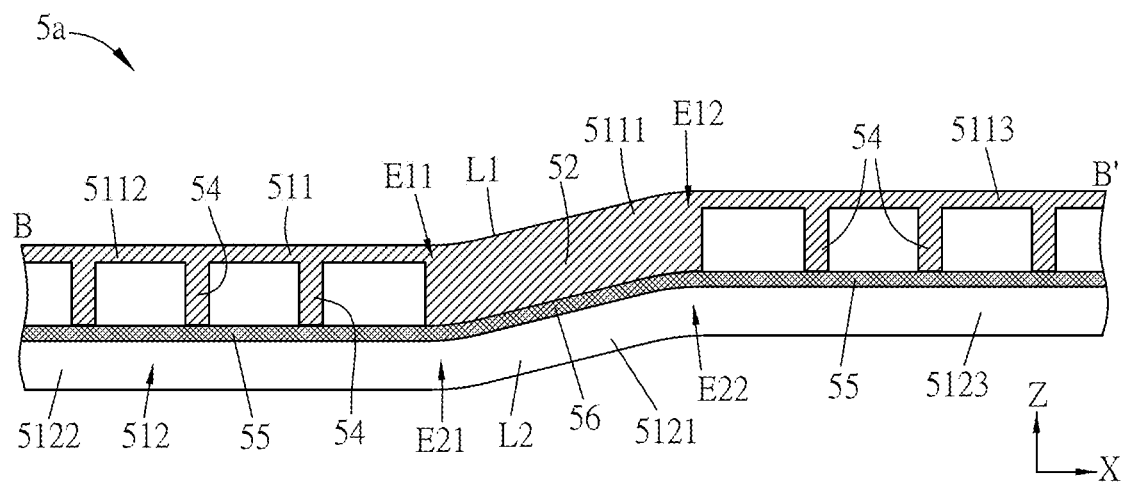
FIG. 6B is a sectional view of FIG. 6A along the line B-B'.
Figure 6C:
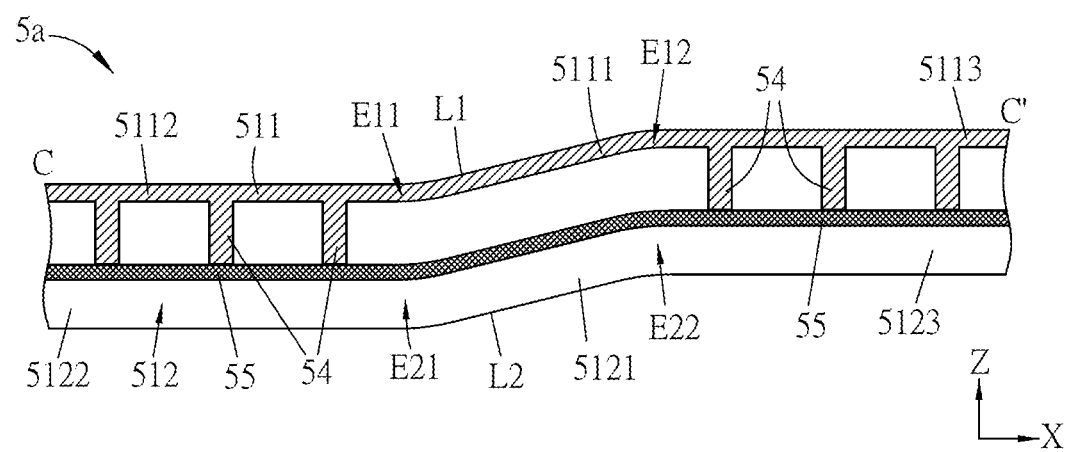
FIG. 6C is a sectional view of FIG. 6A along the line C-C'.
Figure 7A:
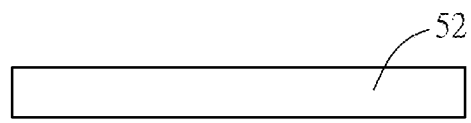
FIGS. 7A-7E are top views of bent structures.
Figure 7B:
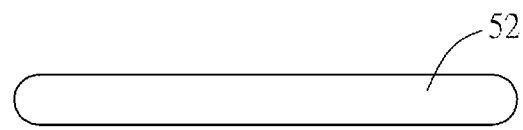
Figure 7C:
Figure 7D:
Figure 7E:
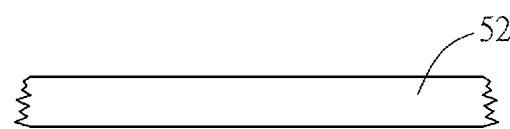

When viewing the bent structure 52 along a direction which is perpendicular to an extending direction of the first plate 511 as shown in top view of FIG. 5A or FIG. 6A, the bent structure 52 is a stripe. In FIG. 7A, one end of the bent structure 52 is a rectangle. In FIG. 7B, one end of the bent structure 52 is a semi-circle. In FIG. 7C, one end of the bent structure 52 is a triangle. In FIG. 7D, one end of the bent structure 52 is a curve. In FIG. 7E, one end of the bent structure 52 is an irregular shape.

Figure 8:
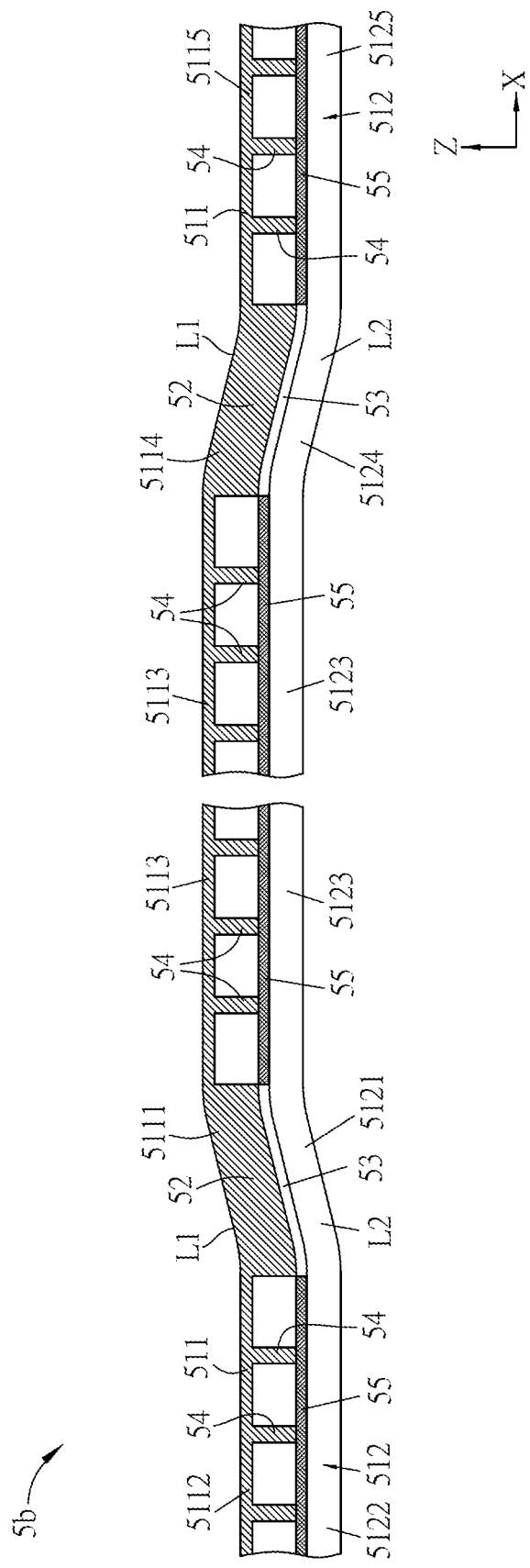
FIG. 8 is a sectional view of temperature plate device.

FIG. 8 is a sectional view of temperature plate device. In the temperature plate device 5b of FIG. 8, each of the first plate 511 and the second plate 512 has multiple step sections. A third step section 5114 of the first plate 511 is connected to the flat sections 5113, 5115 which are at different horizontal planes. A fourth step section 5124 of the second plate 512 is connected to the flat sections 5123, 5125 which are at different horizontal planes. The flat sections 5111, 5115 can be at the same level. The flat sections 5121, 5125 can be at the same level. In other examples, the flat sections 5111, 5115 can be at different horizontal planes, and the flat sections 5121, 5125 can be at different horizontal planes.

As mentioned above, the bent structure is at the step sections of the plates in the temperature plate device, and traverses the first step section between the first step section and the second step section. The bent structure can be stripe. Thus, the length of the bent structure covers the entire length of the step section. The first plate or the second plate is effectively supported by the bent structure to avoid collapse.

In addition, in some embodiments, a gap is between the bent structure and the second plate. For example, the gap is 0.1 mm-0.2 mm. Thus, when pressing the temperature plate device to form the step sections of the first and second plates, the first and second plates still have some freedom to avoid collapse caused from material stretch. The performance of the temperature plate device is maintained. Further, it is possible that no wick structure is in this gap. It is also possible that a wick structure is in this gap.

Although the present disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present disclosure.

What is claimed is:

1. A temperature plate device, comprising:
a plate body comprising a first plate and a second plate, wherein a chamber is defined by the first plate and the second plate, the first plate has a first step section, the second plate has a second step section corresponding to the first step section; and
a bent structure connected to and traversing the first step section between the first step section and the second step section,
wherein the first plate comprises two flat sections at different horizontal planes, and the first step section is connected with the two flat sections of the first plate,
wherein the second plate comprises two flat sections at different horizontal planes, and the second step section is connected with the two flat sections of the second plate,
wherein the first step section has a slope line portion between the two flat sections of the first plate, and two ends of the first step section are bent and respectively connected with the two flat sections of the first plate,
wherein the second step section has a slope line portion between the two flat sections of the second plate, and two ends of the second step section are bent and respectively connected with the two flat sections of the second plate.

2. The temperature plate device of claim 1, wherein a gap is between the bent structure and the second step section.

3. The temperature plate device of claim 1, wherein when viewing the bent structure along a direction which is perpendicular to an extending direction of the first plate, the bent structure is a stripe.

4. The temperature plate device of claim 3, wherein one end of the bent structure is a semi-circle.

5. The temperature plate device of claim 1, wherein the first plate and the bent structure are made by a single plate workpiece.

6. The temperature plate device of claim 1, further comprising a plurality of unbent structures on the first plate between the first plate and the second plate beyond the bent structure.

7. The temperature plate device of claim 6, further comprising a wick structure on the second plate between the unbent structures and the second plate beyond the bent structure.

8. The temperature plate device of claim 7, wherein no wick structure is between the bent structure and the second step section.

9. A temperature plate device, comprising:
a first plate comprising two flat sections at different horizontal planes and a first step section being connected with the two flat sections of the first plate;
a second plate comprising two flat sections at different horizontal planes and a second step section being connected with the two flat sections of the second plate corresponding to the first step section, wherein a chamber is defined by the first plate and the second plate; and
a bent structure connected to and traversing the first step section between the first step section and the second step section, wherein a gap is between the bent structure and the second step section, the bent structure is a stripe when viewing the bent structure along a direction which is perpendicular to an extending direction of the first plate, wherein the first step section has a slope line portion between the two flat sections of the first plate, and two ends of the first step section are bent and respectively connected with the two flat sections of the first plate, wherein the second step section has a slope line portion between the two flat sections of the second plate, and two ends of the second step section are bent and respectively connected with the two flat sections of the second plate.

10. The temperature plate device of claim 9, wherein one end of the bent structure is a semi-circle.

11. The temperature plate device of claim 9, wherein the first plate and the bent structure are made by a single plate workpiece.

12. The temperature plate device of claim 9, further comprising a plurality of unbent structures on the first plate between the first plate and the second plate beyond the bent structure.

13. The temperature plate device of claim 12, further comprising a wick structure on the second plate between the unbent structures and the second plate beyond the bent structure.

14. The temperature plate device of claim 13, wherein no wick structure is between the bent structure and the second step section.

\* \* \* \* \*